United States Patent
Gehring et al.

(10) Patent No.: US 7,057,434 B1
(45) Date of Patent: Jun. 6, 2006

(54) CIRCUIT AND METHOD TO ELIMINATE STARTUP AND SHUTOFF RUNT PULSES FROM CRYSTAL OSCILLATORS

(75) Inventors: Mark R. Gehring, Portland, OR (US); Russell R. Moen, Tigard, OR (US); Joseph D. Stenger, North Plains, OR (US); Eric Mitchell, Lake Oswego, OR (US)

(73) Assignee: Cypress Semiconductor, Corp., San Jose, CA (US)

( * ) Notice: Subject to any disclaimer, the term of this patent is extended or adjusted under 35 U.S.C. 154(b) by 56 days.

(21) Appl. No.: 10/834,950

(22) Filed: Apr. 28, 2004

Related U.S. Application Data

(60) Provisional application No. 60/468,540, filed on May 6, 2003.

(51) Int. Cl.
*H03K 5/01* (2006.01)
*H03B 1/00* (2006.01)
*H03L 1/00* (2006.01)

(52) U.S. Cl. .................. 327/165; 327/166; 331/74; 331/175

(58) Field of Classification Search ............... 331/158, 331/74, 175; 327/175, 176, 165, 166
See application file for complete search history.

(56) References Cited

U.S. PATENT DOCUMENTS

| | | | | |
|---|---|---|---|---|
| 6,028,491 A * | 2/2000 | Stanchak et al. | ............. | 331/75 |
| 6,518,809 B1 * | 2/2003 | Kotra | ............. | 327/175 |
| 6,545,549 B1 * | 4/2003 | Swoboda | ............. | 331/18 |
| 6,759,881 B1 * | 7/2004 | Kizer et al. | ............. | 327/147 |
| 6,771,099 B1 * | 8/2004 | Cavazos et al. | ............. | 327/141 |
| 6,952,123 B1 * | 10/2005 | Kizer et al. | ............. | 327/147 |

* cited by examiner

*Primary Examiner*—Robert J. Pascal
*Assistant Examiner*—James Goodley
(74) *Attorney, Agent, or Firm*—Marger Johnson & McCollom, PC

(57) ABSTRACT

A crystal oscillator circuit which does not produce runt pulses when the oscillator is turned on or off. The circuit includes a crystal oscillator, an integrator which integrates the energy in a plurality of pulses, a threshold circuit which is active when the output of the integrator reaches a pre-specified threshold and gating circuits which gate the output of the crystal oscillator to the output terminal only when the threshold circuit has reached the specified threshold.

20 Claims, 5 Drawing Sheets

CIRCUIT AND METHOD TO ELIMINATE STARTUP AND SHUTOFF RUNT PULSES FROM CRYSTAL OSCILLATORS

RELATED APPLICATION

This application is a non-provisional application of provisional application Ser. No. 60/468,540 filed May 6, 2003. Priority of application 60/468,540 is hereby claimed.

FIELD OF THE INVENTION

The present invention relates to electronic circuits and more particularly to electronic oscillator circuits.

BACKGROUND OF THE INVENTION

An oscillator is a circuit that continually and automatically switches between two states. Oscillators are a widely used type of electronic circuit. Many of the oscillators used in electronic circuits are "crystal oscillators". In a crystal oscillator a crystal is used to control the frequency of the oscillator, that is to control the rate at which the oscillator switches between states.

Crystal oscillators are used in many electronic systems to provide a series of timing pulses that are used by various other components in the system. In crystal oscillators a quartz crystal controls the frequency of a bi-stable circuit that switches between two states.

Low frequency oscillators consume a relatively small amount of power; however, high frequency oscillators consume a relatively large amount of power. Many electronic systems include a relatively low frequency oscillator that is constantly operating and a high frequency oscillator that is turned off when the high frequency circuits in the system are not is use.

For example, in a portable electronic device such as a portable computer, there may be a relatively low speed oscillator which provides timing pulses for some of the logical circuitry such as a microprocessor and there may be a second relatively high speed oscillator that provides pulses for high speed circuitry that transmits and receives radio signals. In such an environment, the radio frequency circuitry may only be used intermittently. For example if the radio frequency circuitry is used to transmit signals from a wireless mouse or a wireless keyboard to the processing unit, the high frequency oscillator may be turned off between key strokes or between movements of the mouse.

Many high frequency circuits (and some low frequency circuits) require clock signals that have a high degree of purity and uniformity. That is, the clock pulses must be of uniform size and shape. Pulses that are shorter than the specified length can produce errors in the logical circuitry which utilizes the output of the oscillator. That is, non uniform clock pulses may cause logical anomalies. For example, circuits may change state at incorrect times or they may not change state at appropriate times. Herein, clock pulses that are shorter or smaller than normal clock pulses are termed "runt" pulses. Runt pulses from an oscillator can cause anomalies in logical circuitry which utilizes the oscillator output.

Frequently, an oscillator will produce runt pulses when the oscillator is started or when the oscillator is turned off. This becomes particularly troublesome in situations when the oscillator is repeatedly, and relatively quickly, turned on and off. The present invention is directed to eliminating runt pulses that may occur when an oscillator is turned on or off.

SUMMARY OF THE INVENTION

The present invention provides a crystal oscillator circuit which does not produce runt pulses when the oscillator is turned on or off. That is, the present invention provides a circuit for producing a series of clock pulses at an output terminal and which does not include any runt pulses when the circuit is turned on or off. The circuit includes a crystal oscillator, an integrator which integrates the energy in a plurality of pulses, a threshold circuit which is active when the output of the integrator reaches a pre-specified threshold and gating circuits which gate the output of the crystal oscillator to the output terminal only when the threshold circuit has reached the specified threshold.

DETAILED DESCRIPTION

The preferred embodiment of the invention is directed to circuitry for eliminating the runt pulses, which may occur when an oscillator is turned on or off. This is particularly important when the oscillator is a high frequency oscillator and the oscillator is frequently turned on and off.

Figure 1A:
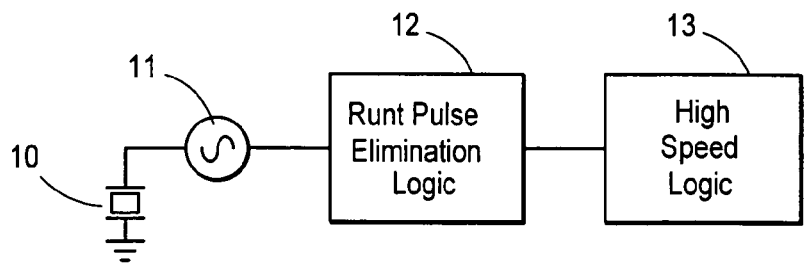
FIG. 1A shows an overall diagram of a preferred embodiment.

FIG. 1A is an overall diagram of a first embodiment of the invention. The embodiment shown in FIG. 1 includes a crystal 10, which controls the oscillation of a high frequency oscillator 11. The output of oscillator 11 goes to runt pulse elimination circuitry 12. The output of runt pulse elimination circuitry 12 is used by logical circuitry 13.

Logical circuitry 13 is circuitry that requires a stream of high purity clock pulses. Runt pulses could cause errors in the operation of logical circuitry 13. For example, logical circuitry 13 may include some circuitry which responds to the leading edge of clock pulses and other circuitry which responds to the trailing edge of clock pulses. Runt pulses would cause lack of synchronization between such circuitry. Logical circuitry 13 could for example be radio frequency circuitry that transmits signals from a wireless keyboard to a personal computer system unit. Such radio frequency circuitry is frequently turned on and off in order to conserve power and runt clock pulses at the beginning or at the end of the operation could cause errors. Alternatively logical circuitry 13 could be any other circuitry that requires high purity clock pulses without runt pulses at the beginning or end of a stream of clock pulses that it receives. The exact nature of circuitry 13 is not particularly relevant to the present embodiment.

Figure 1B:
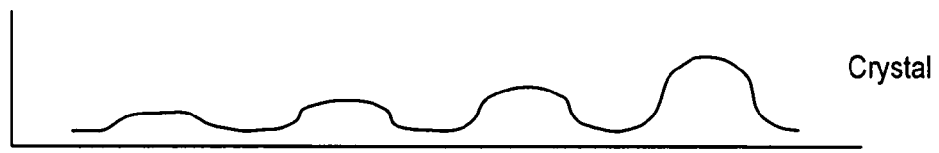
FIG. 1B shows the output of the crystal shown in FIG. 1.

FIG. 1B shows the output of crystal 10 when the associated oscillator 11 is initially powered up. The oscillations start small and gradually grow to their normal specified size.

Stated differently, when a crystal begins to oscillate, the initial oscillations are relatively small. A certain amount of time is required to reach the point of full value output. The exact amount of time required to reach full strength pulses depends on the specific engineering details of the crystal and the associated circuitry; however, substantially all crystals in general use show a growth curve at start up.

Figure 1C:
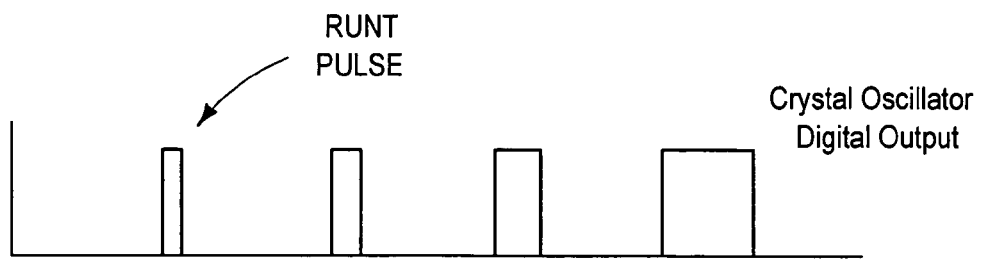
FIG. 1C shows the runt pulses at the output of the crystal oscillator.

FIG. 1C shows runt pulses generated as a result of the gradual increase in the output of the crystal. Generally with most oscillators, the period of oscillation will be fixed; however, the width of the pulses at startup will not be as wide as when the circuit is in normal operation. The reason for this is that the initial pulses have a lower amplitude and the trigger gating circuits at different times. That is, some time will pass and some runt pulses will be generated before the oscillator reaches its specified performance. The runt pulses become of critical significance in high speed circuits and especially in high-speed low-power circuitry. In high speed low power circuitry, a high purity stream of clock pulses are needed for reliable operation and furthermore. Furthermore, the amount of time that an oscillator is operating is of critical significance relative to the amount of power used, hence, the oscillator is frequently turned on and off. Runt clock pulses such as those shown in FIG. 1C can cause errors in the operation of circuitry that utilizes the clock pulses.

It is noted that for convenience of illustration only a few pulses are shown in FIG. 1B; however many runt pulses may in fact occur prior to the pulses reaching their specified value. For example, for an oscillator operating at 10 mega Hertz, the initialization period may last for one millisecond, thus there may be five thousand runt pulses prior to the time that that pulses reach their specified value. It is noted that FIG. 1C only shows the runt pulses that occur when the circuit is turned on or enabled. Similar runt pulses can occur when the circuit is turned off.

Figure 2B:
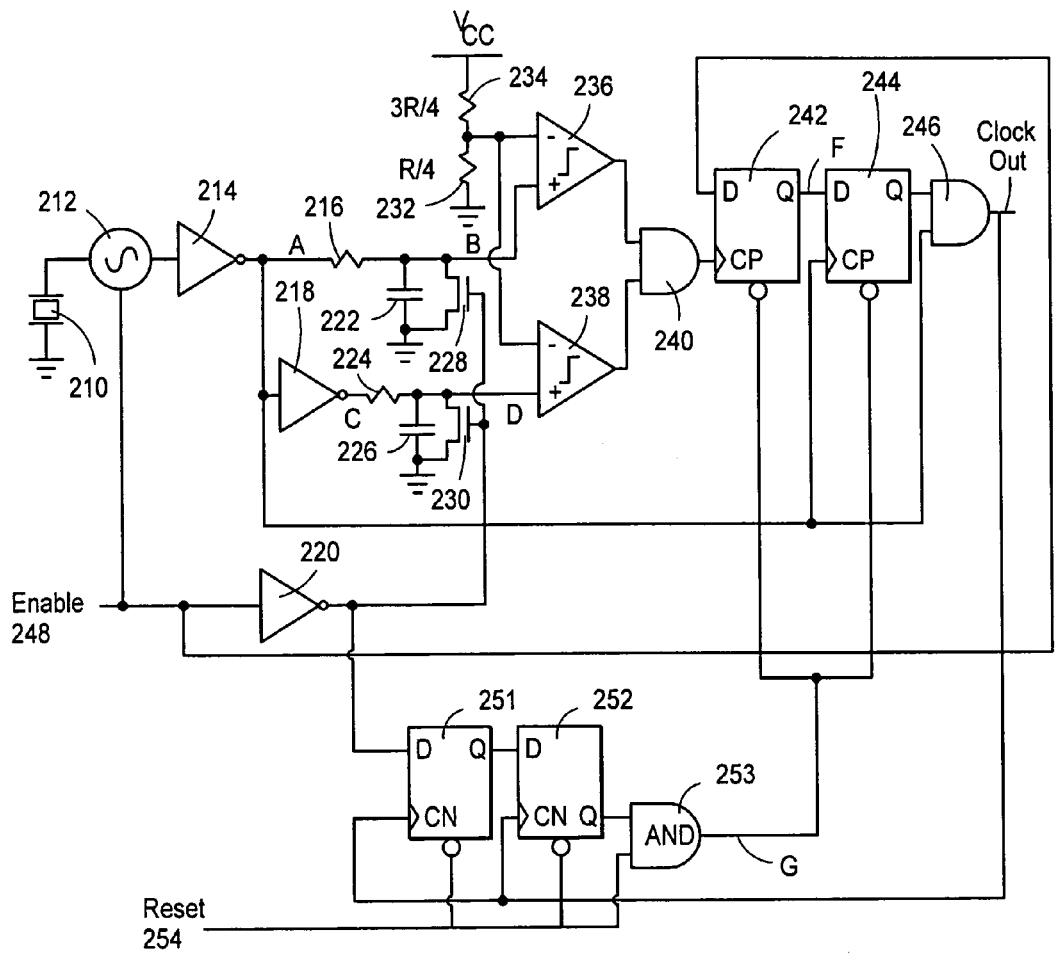
FIG. 2B shows the details of the runt pulse elimination circuitry.
Figure 2A:
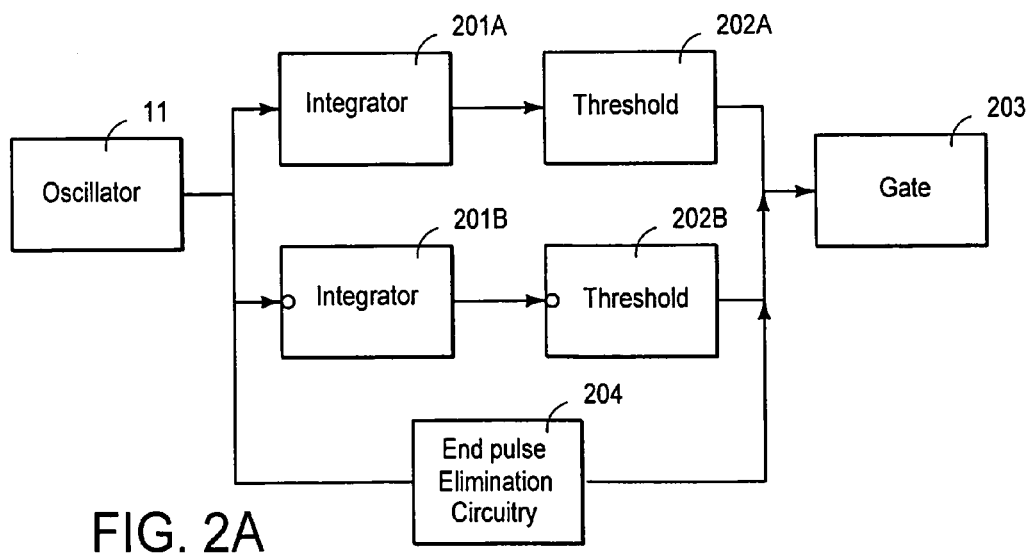
FIG. 2A is a block diagram of the runt pulse elimination circuitry.
Figure 3:
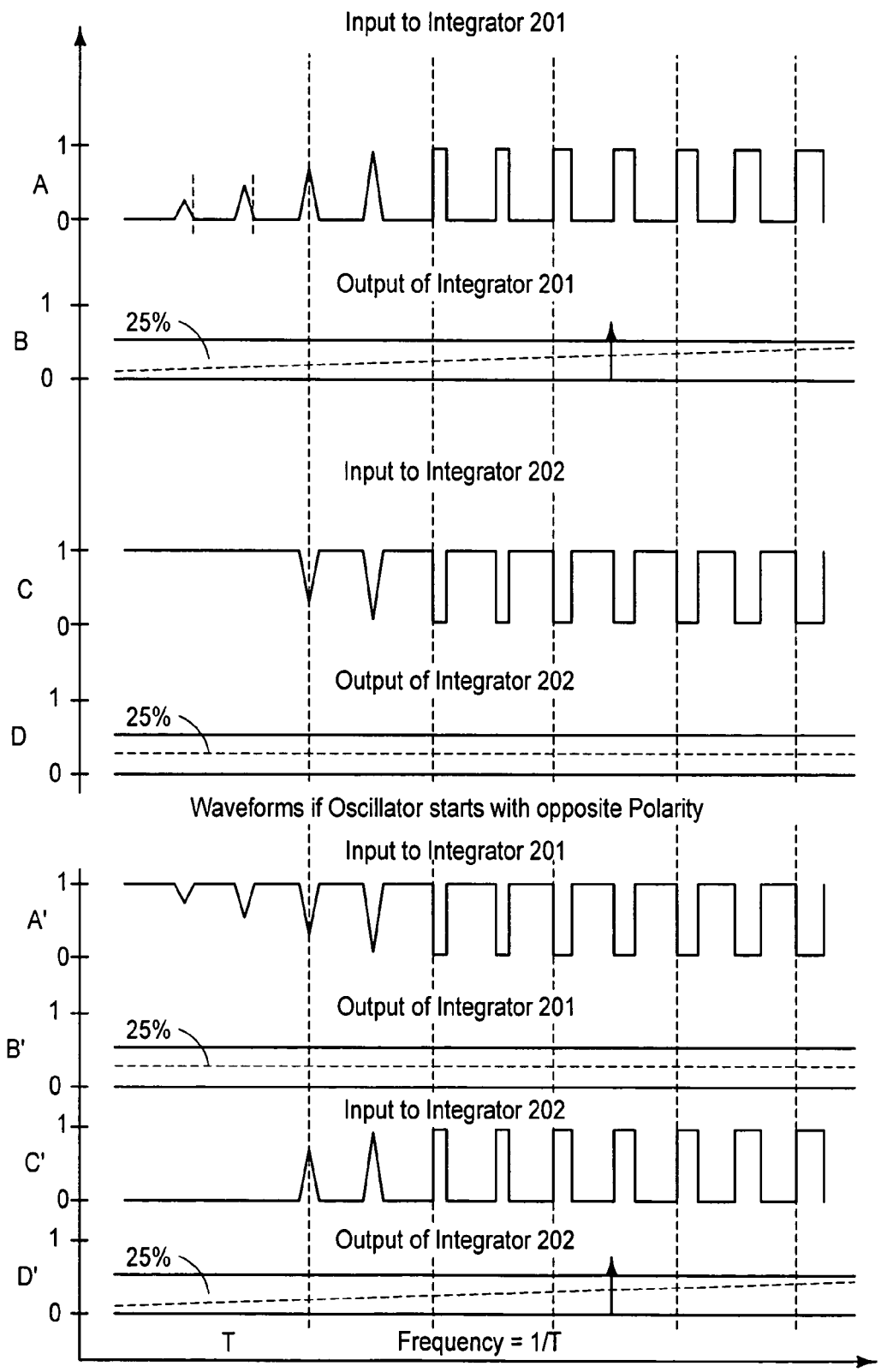
FIG. 3 shows the waveforms at various points in the circuit.
Figure 5:
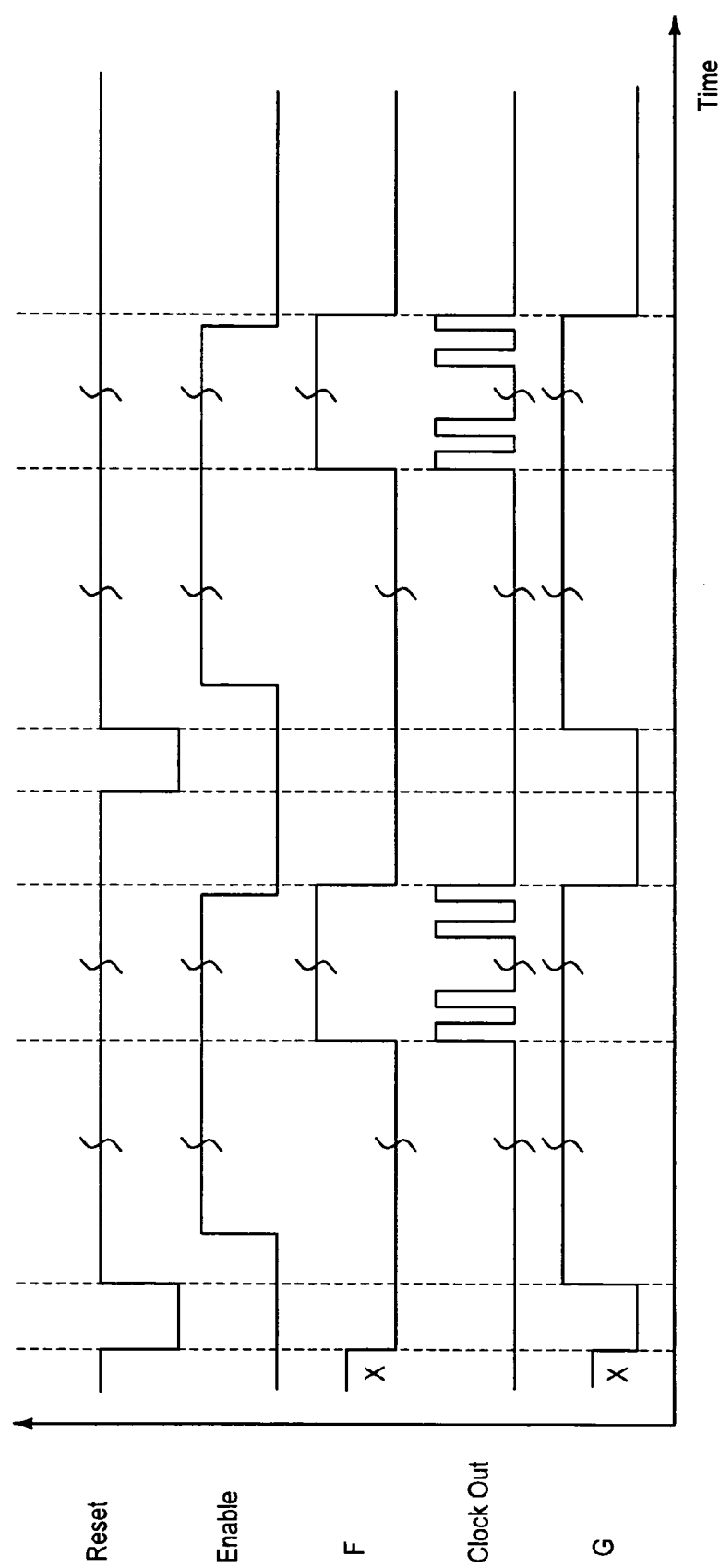
FIG. 5 is a timing diagram for the circuit shown in FIG. 2A.

The details of the circuitry which eliminates runt pulses at start up and shut down are shown in FIGS. 2A and 2B. Wave forms for the circuit are shown in FIG. 3 and a timing diagram for the circuit is shown in FIG. 5.

The runt pulse elimination circuitry has the main parts as shown in FIG. 2A. The first part is a set of integrators 201A and 201B, the second part of the circuit consists of a set of threshold circuits 202A and 202B, the third part of the circuit consists of gating circuitry 203, and the fourth part is circuitry 204 to eliminate runt pulses when the circuit is turned off.

The way in which the circuit eliminates runt pulses at start up will be explained first. The way in which the circuit eliminates any runt pulses which occur at shut down time will be described later.

The output of oscillator 11 provides inputs to two integration circuits 201A and 201B. However, prior to going to integrator 201B, the output of the oscillator is inverted. This is indicated by the circle at the input of integrator 201B. The inverter at the input to integrator 201B is shown in detail as inverter 218 in FIG. 2B. The output of the integrators goes to threshold circuits 202A and 202B. Finally, there is a logical gating circuit 203.

It is noted that the oscillator 11 may begin in one of two states. In one state the oscillator output begins at a high voltage and goes to a low voltage. In the other state, the oscillator output begins at a low voltage and goes to a high voltage. The reason for this is that it is serendipitous as to which of the two states the oscillator will "start in" when the circuit is activated. That is, at one of the points A or C (in FIG. 2B), the pulses will go from zero to a higher voltage value and at the other point the pulses will go from a higher voltage to zero.

The waveforms that occur at various points in the circuit are shown in FIG. 3. The signal at point A will either be the waveform designated A or the waveform designated A' depending upon the state in which the oscillator begins operating. It is noted that the actual voltage values that the signals will achieve is a matter of engineering design. The actual voltages in any particular circuit will depend on various factors such as the specific transistors used in the circuitry and various requirements and characteristics of the circuitry.

In FIG. 3 a relatively high voltage is designated as 1 and a relatively low voltage is designated as 0. The vales 0 and 1 should not be interpreted as being actual voltages. Instead they should be interpreted as being similar to the binary values 0 and 1.

Logical circuit 203 will only pass clock pulses to the output (that is, to circuit 13) after both of the integration circuits 201A and 201B reach a certain threshold. The integration circuits 201A and 2012B will only both reach the specified threshold if the pulses produced by the oscillator meet certain width or duty requirements.

The outputs of the integrators are shown in FIG. 3 by the waveforms designed B and D. The output of the integrators when the circuit begins in one state are shown by the curves B and D. Alternately when the circuit begins in the alternate state the output of the integrators is shown by the by the waveforms designed B' and D'. Note, that where the pulses go from a high voltage (designated as 1 in FIG. 3) to a low voltage (designated as 0 in FIG. 3), the integrator output will always be high. This is situation is illustrated by the pulse stream designated C in FIG. 3, which shows pulses going from a value of 1 to a lower value. In this case the output of the integration circuitry is basically flat, and it will always be above the designated threshold.

However, where the pulses go from a low voltage to a relatively high voltage, the output of the integrator will gradually grow as indicated by curves B and D' in FIG. 3. This type of pulse stream is indicated by waveform A. Note that in this case the output of the integrator will start at zero and gradually grow to a point where it crosses the designated threshold. In FIG. 3, the point at which the output of the integrator crosses the designated threshold is indicated by the upward pointing arrow in the waveform B.

The details of the circuit in FIG. 2B will now be explained. It is noted that FIG. 2B shows the details of the runt pulse elimination logic 12 shown in FIG. 1A. The operation of the circuit is initiated by an external signal applied to terminal 210. This signal indicates that some other circuitry (not specifically shown in the figures) generated a signal indicating that operation of the high frequency oscillator should be initiated. The operation of the high frequency oscillator would for example be initiated when the circuitry found that some information needed to be transmitted by a radio signal. Such a radio signal would for example be generated by circuit 13 shown in FIG. 1. In a system that includes a wireless keyboard connected to a central processing unit, the radio transmission could be a signal from the keyboard to the central processing unit. Such a signal might be needed and initiated when an operator pressed a key on the keyboard.

The signal on enable terminal 210 initiates operation of the oscillator 11. (Note the details of oscillator 11 will be explained later with respect to FIG. 4) The signal from oscillator 11 passes through inverter 214 and the output of inverter 214 passes through inverter 218. As previously explained the oscillator 11 may start in one of two possible states. Thus the signal at point A may either be the waveform A or the waveform A' shown in FIG. 3. Assuming for the moment that the waveform at point A is the waveform A shown in FIG. 3, then the waveform at point C is the waveform C shown in FIG. 3.

Resistor 216 and capacitor 222 form the integrator 201A shown in FIG. 2A. Resistor 224 and capacitor 226 form the integrator 201B shown in FIG. 2A. The enable signal at terminal 210 passes through inverter 220 and the output of inverter 220 controls transistor switches 228 and 230. When closed, switches 228 and 230 pull the output of the integrators to ground value. When an enable signal is applied to terminal 210, switches 228 and 230 are opened and the integrators can begin accumulating charge.

The waveforms at the output of the integrators is shown by curves B and D or B' and D' in FIG. 3. If the pulses at point A are pulses that start at zero voltage and increase in value, as shown by curve A in FIG. 3, the output of the integrator will gradually increase as shown in curve B in FIG. 3. On the other hand in this situation the signal at point C will be the waveform C shown in FIG. 3 and the signal at point D will be the waveform shown by curve D. That is since the signal at pint C will begin at a high value, the output at point D will essentially start at a high value and remain at this value.

Alternatively, if the oscillator begins in a different state, the waveforms will be as shown by curves A', to D' in FIG. 3. In this case, the output of integrator 201A will be high from the beginning of the cycle and the output of integrator 201B will gradually increase as indicated by curve D' in FIG. 3.

Schmidt triggers 236 and 238 form the threshold circuits 202A and 202B shown in FIG. 2A. Resistors 232 and 234 form a voltage divider that sets the threshold value for circuits 236 and 238. As specifically shown here this value is established as twenty five percent of the total circuit voltage. The threshold value is a matter of engineering choice and it will vary depending up various external considerations.

The output of the threshold circuits 236 and 238 form inputs to an AND circuit 240. The output of AND circuit 240 will only be high if both of the threshold circuits have reached their threshold value. It should be noted that when the oscillator starts in one state, the output of threshold circuit 236 will be above the threshold value from the beginning and if the oscillator starts in the other state, the output of threshold circuit 238 will be above the threshold value. However, in either situation one of the threshold circuits will not reach the threshold until both of the integrators indicate that the pulses from the oscillator are of the appropriate duration. Thus, and circuit 240 will not produce an output until the pulses from the oscillator are of the proper duration.

Flip-flops 242 and 244 are D type flip flops that are triggered by the positive edge of a clock pulse. Note the clock input of flip flops 242 and 244 is labeled "CP". Flip flops 242 and 243 form the gating circuit 203 shown in FIG. 2B. Flip flop 242 does not produce an output until there is both an enable signal from terminal 210 and AND circuit 240 has produced an output. The flip flop 244 is enabled by the output of flip flop 242; however, it does not produce and output until it receives the leading edge of a pulse from oscillator 11. This insures that the output of the circuit will only begin at the beginning of a pulse from oscillator 11. Flip flops 242 and 243 are reset when the output of AND circuit 253 passes a reset signal from the reset terminal 254. A signal appears on reset terminal 254 (from external circuitry—not specifically shown in the Figure) after the enable signal on terminal 210 is terminated.

The output of flip flop 244 forms one input of AND circuit 246. The second input of AND circuit 246 is the output of inverter 214. The output of AND circuit will begin at the leading edge of a pulse; as a result of the input from flip flop 244, there will only be an output when the input pulses are not runt pulses. That is, the clock out signal will be generated when both threshold circuits 236 and 238 have been satisfied and a clock pulse appears.

Figure 4:
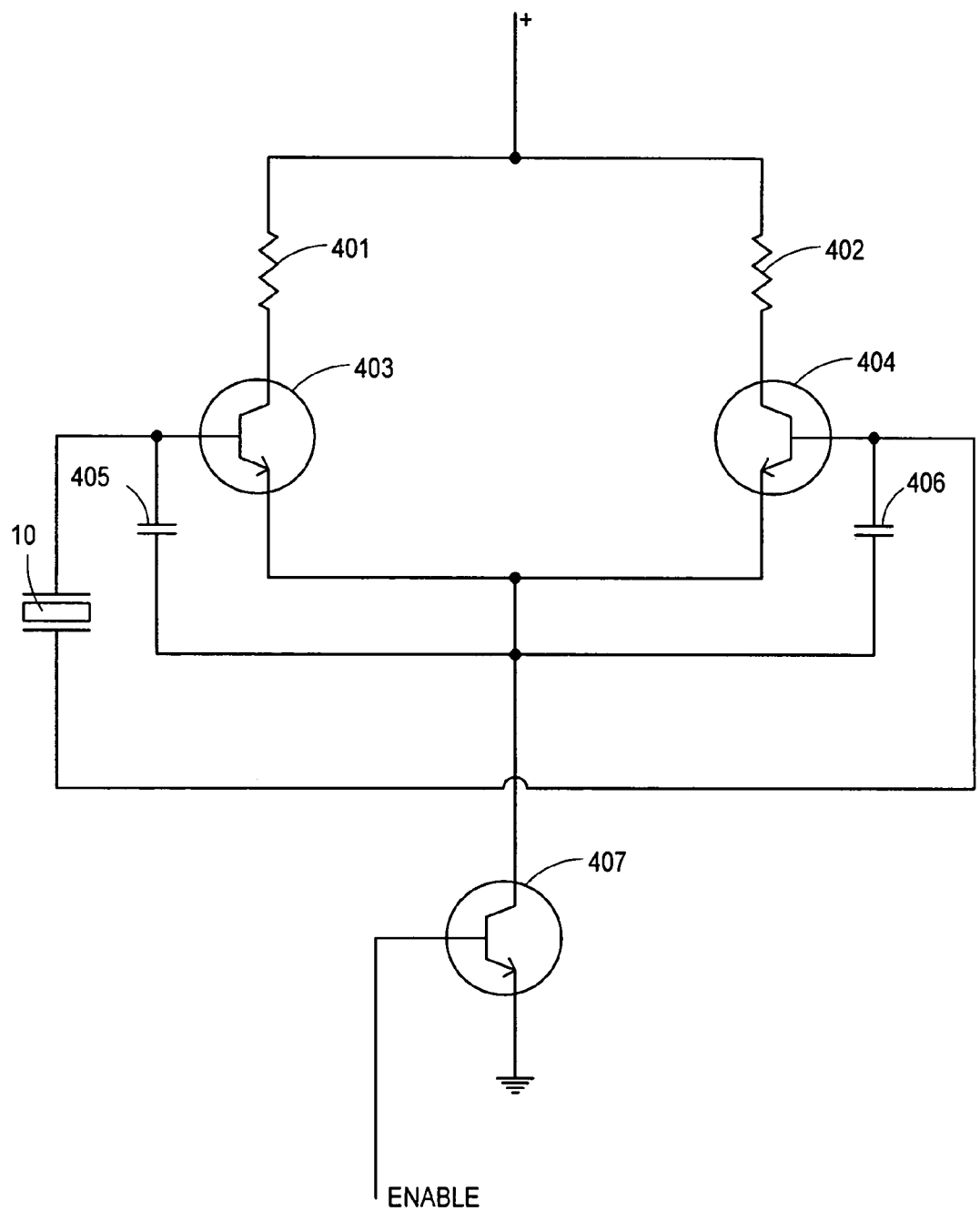
FIG. 4 is a circuit diagram of the crystal oscillator shown in FIG. 2B.

Oscillator 11, is a normal type of oscillator. A simple embodiment of such an oscillator is shown in FIG. 4. One side of the oscillator includes resistor 401, transistor 403 and capacitor 405. The other side of the oscillator includes resistor 402, transistor 404 and capacitor 406. Crystal 10 is connected to the base of transistor s 403 and 404. Transistor 407, turns the oscillator on and off in response to the enable signal. Naturally in other embodiments, the oscillator 11 could be a more complex oscillator.

The above description illustrates how runt pulses are eliminated when the oscillator is turned on. The details of the circuitry that eliminates runt pulses when the oscillator is disabled, that is, the details of circuitry 204 shown in FIG. 2A will now be explained. This circuitry consists of D type flip flops 251 and 252 shown in FIG. 2B. Flip Flops 251 and 252 are triggered by the negative going edge of the clock pulse. Note that the clock input is labeled CN.

The clock output signal from AND circuit 246 provides the clock input to the flip flops. The D input to flip flop 251 is the inverted enable signal 210 from inverter 220. The output of flip flop 251 provides the D input to flip flop 252. These flip flops are reset after the oscillator is turned off.

FIG. 5 is a timing diagram showing the operation of the circuit shown in FIG. 2A. The timing diagram in FIG. 5 shows the timing of the reset signal on terminal 254, the enable signal on terminal 210 and the clock out signal at the output of AND circuit 246. Also shown are the waveforms at point F and G in the circuit. Of particular importance, FIG. 5 shows that when the enable signal goes negative (even when this happens in the middle of a clock out pulse) the output pulse is not turned into a runt pulse. Through the action of flip flops 251 and 252, the ouput is only terminated when the pulse is complete.

It is noted that the output of AND gate 246 provides the clock signal that is be used by circuitry 13 shown in FIG. 1A. The output of AND circuit 246 can be termed an output terminal. The term "output terminal" as used herein can refer to any connection between the oscillator circuitry and any subsequent circuitry. It is also noted that the entire circuit including the oscillator 11 and the runt pulse elimination circuit 12 can be termed an oscillator. On the other hand bi-stable circuit 11 itself can be considered to be a normal oscillator. Which meaning is intended is evident from the context in which the terms are used.

An alternative embodiment of the invention utilizes only one integrator and one threshold circuit. In this alternative embodiment, the bi-stable oscillator is forced to always begin operating in one particular state. That is, the bi-stable circuit is not completely symmetrical. The bi-stable circuit is biased to one particular state. Thus, one can insure that the pulse stream always begins with pulses such as those shown by waveform A in FIG. 3 and only one integrator and one threshold circuit are therefore needed.

While the specific embodiment shown herein relates to high frequency circuitry. Other embodiments of the inventions utilize the same circuitry in relatively low frequency applications. The elimination of runt pulses can be done in either high frequency or in low frequency applications.

While the invention has been shown and described with respect to various embodiments thereof, it will be understood by those skilled in the art that various changes and modifications can be make to the described embodiments, without departing from the spirit and scope of the invention. The scope of applicant's invention is limited only by the appended claims.

We claim:

1. An oscillator circuit which includes:
    an output terminal,
    a bi-stable circuit which generates a series of pulses having a particular frequency,
    a crystal which controls said frequency of said bi-stable circuit,
    an integrator which integrates the energy in a plurality of said pulses generated by said bi-stable circuit to generate a constant signal representing the average duty cycle of said plurality of pulses,
    a threshold circuit which is activated when constant signal reaches a pre-specified threshold value, and
    gating circuitry which gates said series of pulses to said output terminal only when said threshold circuit has reached said specified threshold.

2. The circuit recited in claim 1 wherein said bi-stable circuit generates runt pulses when said bi-stable circuit and said crystal are activated.

3. The circuit recited in claim 1 wherein runt pulses generated when said bi-stable circuit is activated do not reach said output terminal.

4. The circuit recited in claim 1 including two integrator circuits, one of which receives said series of pulses and one of which receives the inverse of said series of pulses.

5. The circuit recited in claim 4, including two threshold circuits, one of which is connected to the output of each of said integrator circuits.

6. The circuit recited in claim 5 including gating circuitry which only gates said series of pulses to said output when both of said threshold circuits are satisfied.

7. An oscillator circuit which includes:
    an output terminal,
    a bi-stable circuit which generates a series of pulses,
    an integrator which integrates the energy in a plurality of pulses generated by said bi-stable circuit to generate a constant signal representing the average duty cycle of said plurality of pulses,
    a threshold circuit which is activated when said constant signal reaches a pre-specified threshold, and
    gating circuitry which gates said series of pulses to said output terminal only when the threshold circuit has reached said specified threshold.

8. The oscillator recited in claim 7 wherein the frequency of said bi-stable circuit is controlled by a crystal.

9. The circuit recited in claim 7 including an input for enabling and disabling said bi-stable circuit.

10. The circuit recited in claim 9 wherein runt pulses are generated when said hi-stable circuit is enabled and disabled.

11. The circuit recited in claim 10 wherein said gating circuitry prevents said runt pulses from reaching said output terminal when said circuit is enabled.

12. The circuit recited in claim 10 wherein said gating circuitry prevents runt pulses generated when said bi-stable circuit is de-activated from reaching said output terminal.

13. The circuit recited in claim 7 including two integrator circuits one of which receives said series of pulses and one of which receives the inverse of said series of pulses.

14. The circuit recited in claim 13, including two threshold circuits, one of which is connected to the output of each of said integrator circuits.

15. The circuit recited in claim 14 including gating circuitry which only gates said series of pulses to said output when both of said threshold circuits are satisfied.

16. A system for producing a series of pulses at a particular frequency, said system including:
    an output,
    a bi-stable circuit which generates a first series of pulses,
    integrator means which integrates the energy in a plurality of said pulses in said first series of pulses to generate a constant signal representing the average duty cycle of said plurality of pulses,
    threshold means which is activated when said constant signal reaches a pre-specified threshold, and
    gating means which gates said first series of pulses to said output only when the threshold means has reached said specified threshold.

17. The system recited in claim 16 including a crystal which controls the frequency in said first series of pulses generated by said by-stable circuit.

18. The system recited in claim 16 wherein said bi-stable circuit generates runt pulses when said bi-stable circuit is activated and said integration means and said threshold means only generate an output when the duty cycle of said first series of; pulses reaches a threshold value, thereby only activating said gating means to gate pulses to said output when there are no runt pulses.

19. The system recited in claim 16 including two integrator means, one of which receives said first series of pulses and one of which receives the inverse of said first series of pulses.

20. The system recited in claim 19, including two threshold means, one of which is connected to the output of each of said integrator means.

* * * * *